US008527921B2

(12) United States Patent  
Cerny et al.

(10) Patent No.: US 8,527,921 B2
(45) Date of Patent: Sep. 3, 2013

(54) CONSTRAINED RANDOM SIMULATION COVERAGE CLOSURE GUIDED BY A COVER PROPERTY

(75) Inventors: Eduard Cerny, Worcester, MA (US); Surrendra A. Dudani, Newton, MA (US); William R. Dufresne, North Attleboro, MA (US)

(73) Assignee: Synopsys, Inc., Mountain View, CA (US)

( * ) Notice: Subject to any disclaimer, the term of this patent is extended or adjusted under 35 U.S.C. 154(b) by 1191 days.

(21) Appl. No.: 12/059,096

(22) Filed: Mar. 31, 2008

(65) Prior Publication Data

US 2009/0249267 A1    Oct. 1, 2009

(51) Int. Cl.
*G06F 17/50* (2006.01)
(52) U.S. Cl.
USPC .......................... 716/106; 716/104; 716/111
(58) Field of Classification Search
USPC .......................................... 716/104, 106, 111
See application file for complete search history.

(56) References Cited

U.S. PATENT DOCUMENTS

| 3,719,885 A | 3/1973 | Carpenter |
| 5,414,716 A | 5/1995 | Bershteyn |
| 2008/0082946 A1* | 4/2008 | Zilic et al. .................. 716/5 |

OTHER PUBLICATIONS

Wunderlich, Hans-Joachim, "Multiple Distributions for Biased Random Test Patterns", 1988 International Test Conference, pp. 235-244.
Zhang, Liang et al., "A Framework for Automatic Design Validation of RTL Circuits Using ATPG and Observability-Enhanced Tag Coverage", IEEE Transactions on Computer-Aided Design of Integrated Circuits and Systems: vol. 25, No. 11, Nov. 2006, pp. 2526-2538.
Chen, Xiaoding et al.,"Characteristics States and Cooperative Game Based Search for Efficient Sequential ATPG and Design Validation".

* cited by examiner

*Primary Examiner* — Sun Lin
(74) *Attorney, Agent, or Firm* — Park, Vaughan, Fleming & Dowler, LLP

(57) ABSTRACT

One embodiment of the present invention provides a system which verifies a circuit design by biasing input stimuli for the circuit design to satisfy one or more temporal coverage properties to be verified for the circuit design. This system performs a simulation in which random input stimuli are applied to the circuit design. The system performs the simulation by using a finite state automaton (FSA) instance for a temporal coverage property to observe inputs and outputs of the circuit, and by using soft constraints associated with the FSA instance to bias the input stimuli for the circuit design so that the simulation is likely to progress through a sequence of states which satisfy the temporal coverage property.

21 Claims, 8 Drawing Sheets

CONSTRAINED RANDOM SIMULATION COVERAGE CLOSURE GUIDED BY A COVER PROPERTY

BACKGROUND

1. Field of the Invention

The present invention generally relates to techniques for verifying the correctness of a circuit design. More specifically, the present invention relates to an input vector generation technique for achieving coverage closure which biases random input stimuli based on a temporal coverage property.

2. Related Art

Advances in semiconductor fabrication technology have given rise to dramatic increases in the number of transistors per semiconductor device. This increase in transistor count is empowering computer architects to create digital circuit designs with an ever-increasing design complexity. Consequently, as digital circuit designs become more complex, the effort required to verify the correctness of their implementation also becomes more involved.

To verify the functionality of a circuit design, circuit design verification teams typically apply random input stimuli onto a circuit design under verification (DUV) to stimulate the DUV and compare the response from simulation to the expected response. Simulating the DUV against random input stimuli is a stochastic process which relies on a high volume of input vectors to achieve a reasonable coverage of the behavior of the DUV. However, as the circuit designs become more complex, the random input stimuli become less effective at covering the important corner cases of the DUV.

Circuit design verification teams have attempted to guide the test selection process to effectively cover the important corner cases of the DUV. In doing so, they have attempted to employ methods which include using directives from the designer, non-covered bins in SystemVerilog covergroups as supplementary constraints, genetic algorithms, user-supplied additional constraints, and Bayesian networks or Markov chains. Unfortunately, none of these approaches provides a complete and automatic solution for biasing the random input stimuli toward achieving coverage closure.

Hence what is needed is a more effective technique for guiding input stimuli toward the important cases of a circuit design under verification.

SUMMARY

One embodiment of the present invention provides a system which verifies a circuit design by biasing input stimuli for the circuit design to satisfy one or more temporal coverage properties to be verified for the circuit design. During operation, this system performs a simulation in which random input stimuli are applied to the circuit design. The system performs this simulation by using a finite state automaton (FSA) instance for a temporal coverage property to observe inputs and outputs of the circuit, and by using soft constraints associated with the FSA instance to bias the input stimuli for the circuit design so that the simulation is likely to progress through a sequence of states which satisfy the temporal coverage property.

In a variation on this embodiment, the system uses the soft constraints to bias the input stimuli based on a current state of the FSA instance.

In a variation on this embodiment, if the FSA instance reaches an accepting state for the temporal coverage property, the system marks the temporal coverage property as satisfied.

In a variation on this embodiment, the system uses the FSA instance to observe the inputs and outputs of the circuit by concurrently using multiple FSA instances associated with one or more temporal coverage properties to observe the inputs and outputs of the circuit.

In a variation on this embodiment, the system biases the input stimuli for the circuit by ensuring that FSA instances which are closer to an accepting state have a higher likelihood of biasing the input stimuli than FSA instances which are farther from an accepting state.

In a variation on this embodiment, prior to performing the simulation, the system performs a preceding non-biased simulation, in which the input stimuli to the circuit are not biased to satisfy specific temporal coverage properties. After the preceding non-biased simulation is complete, the simulation subsequently biases the input stimuli to cover temporal coverage properties which were not covered during the non-biased simulation.

In a variation on this embodiment, prior to performing the simulation, the method further comprises converting the temporal coverage property into the FSA and the soft constraints.

In a variation on this embodiment, the FSA is a deterministic FSA.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

Circuit Verification Environment

Figure 1:
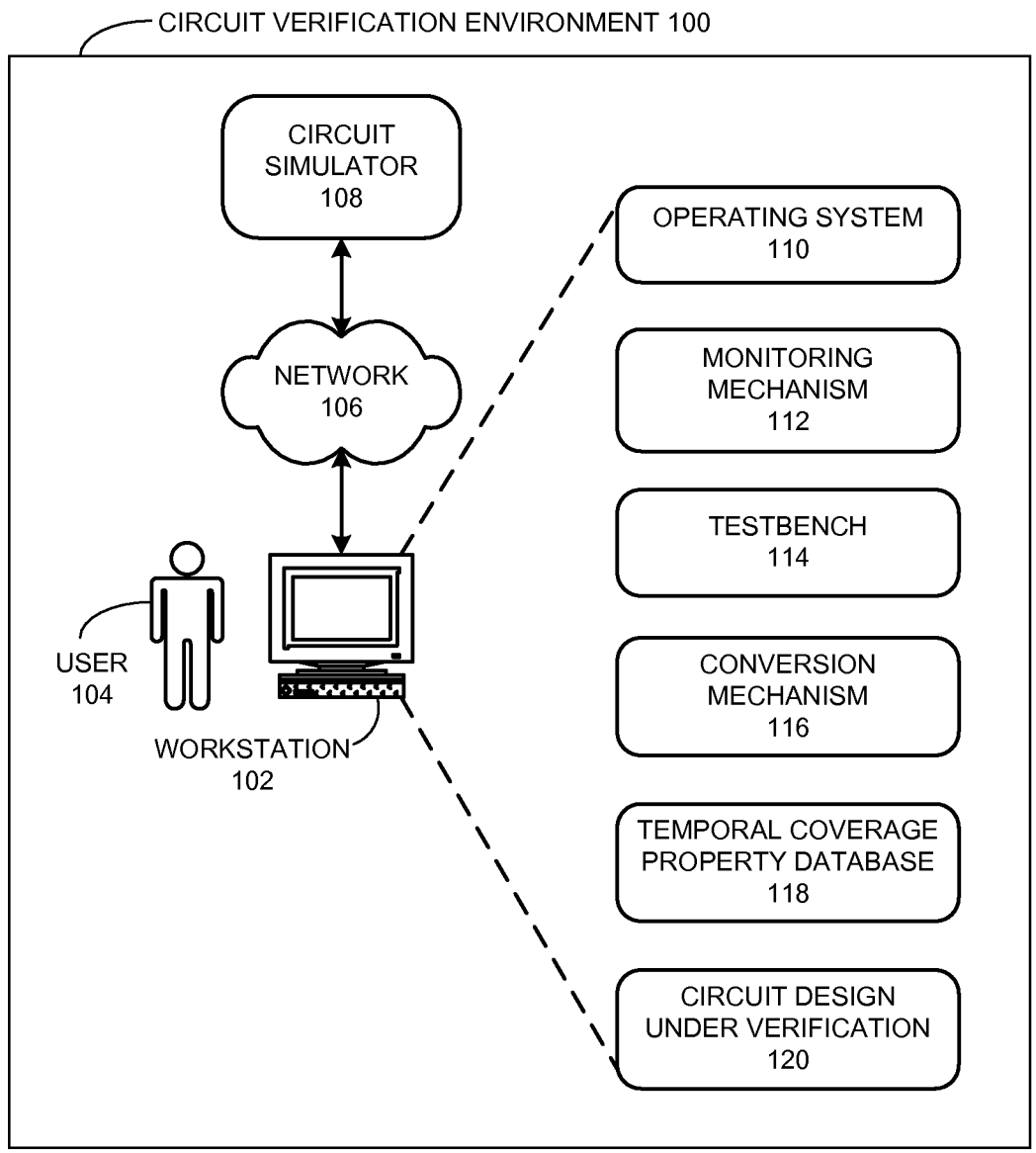
FIG. 1 illustrates a circuit verification environment in accordance with an embodiment of the present invention.

FIG. 1 illustrates circuit verification environment 100 in accordance with an embodiment of the present invention. Circuit verification environment 100 includes a number of computer systems, which can generally include any type of computer system based on a microprocessor, a mainframe computer, a digital signal processor, a portable computing device, a personal organizer, a device controller, or a computational engine within an appliance. More specifically, referring to FIG. 1, the circuit verification environment 100 includes workstation 102, user 104, network 106, and circuit simulator 108.

Network 106 can include any type of wired or wireless communication channel capable of coupling together computer nodes. This includes, but is not limited to, a local area network, a wide area network, or a combination of networks. In one embodiment of the present invention, network 106 includes the Internet. In some embodiments of the present invention, network 106 includes phone and cellular phone networks.

Workstation 102 can generally include any device including computational capability and including a mechanism for interacting with user 104. Workstation 102 includes operating system 110, monitoring mechanism 112, testbench 114, conversion mechanism 116, temporal coverage property database 118, and circuit design under verification 120.

User 104 can include an individual, a group of individuals, an organization, a group of organizations, a computing system, a group of computing systems, or any other entity which can interact with the circuit verification environment 100.

Circuit simulator 108 can generally include any device including computational capability for performing a circuit simulation, including any type of computer system based on a microprocessor, a mainframe computer, a digital signal processor, a portable computing device, a device controller, a field-programmable gate array (FPGA), or a group of FPGAs.

Note that different embodiments of the present invention may use different configurations, and are not limited to the configuration illustrated in circuit verification environment 100. In some embodiments of the present invention, workstation 102 is coupled to circuit simulator 108 through network 106, while in other embodiments of the present invention, workstation 102 is coupled directly to circuit simulator 108. In yet another embodiment of the present invention, workstation 102 includes circuit simulator 108.

Figure 2:
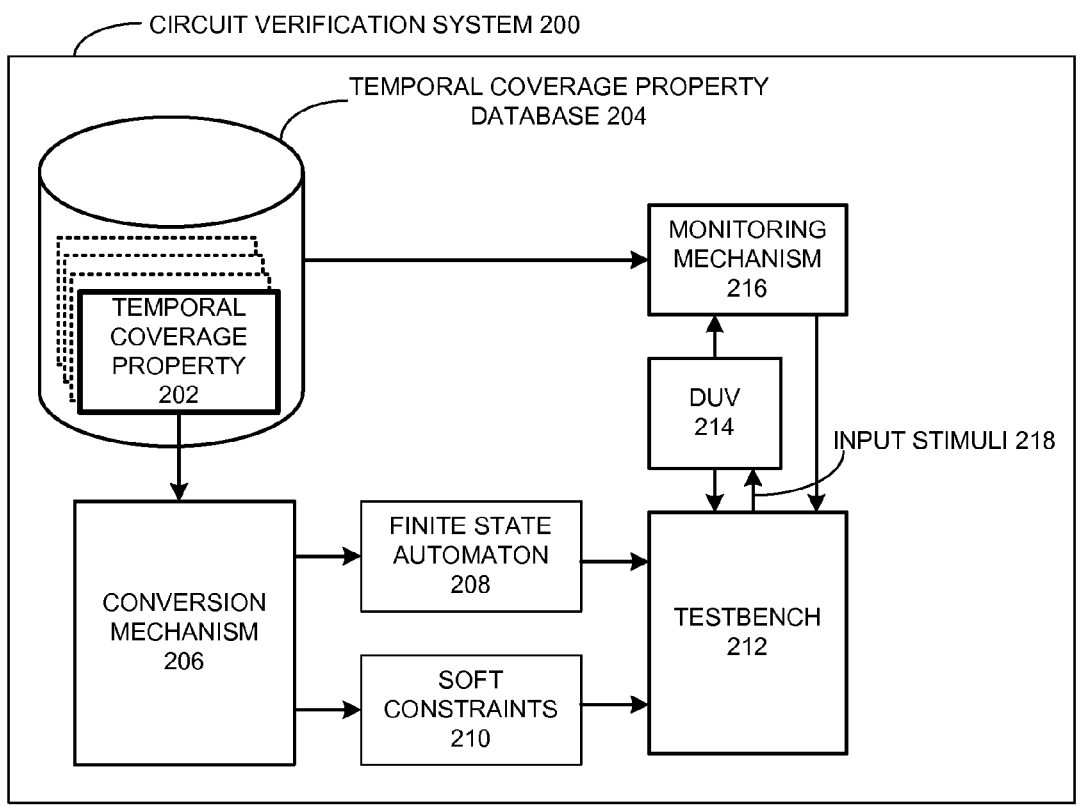
FIG. 2 illustrates a circuit verification system in accordance with an embodiment of the present invention.

FIG. 2 illustrates circuit verification system 200 in accordance with an embodiment of the present invention. Circuit verification system 200 includes temporal coverage property database 204, conversion mechanism 206, testbench 212, design under verification (DUV) 214, and monitoring mechanism 216.

Temporal coverage property database 204 can include any type of system for storing data in non-volatile storage. This includes, but is not limited to, systems based upon magnetic, optical, or magneto-optical storage devices, as well as storage devices based on flash memory and/or battery-backed up memory. Note that temporal coverage property database 204 can be coupled to a server, to a client (such as workstation 102 of FIG. 1), or directly to a network. Temporal coverage property database 204 holds a collection of temporal coverage properties 202, which together make up the verification coverage plan for DUV 214.

During runtime, conversion mechanism 206 accepts one or more temporal coverage property 202 as input and generates a corresponding finite state automaton (FSA) 208 and a collection of soft constraints 210. A temporal coverage property includes a description for a sequence of events which are to be covered by a verification input stimuli, and can be any temporal coverage property which can be converted into a deterministic finite state automaton (DFSA). In one embodiment of the present invention, a temporal coverage property can be in the form of a regular expression. A finite state automaton (FSA) includes a graph G(V, E) consisting of vertices V and edges E, wherein the vertices describe the allowable states of the respective temporal coverage property, and the edges describe the conditions which allow a state transition from a first state onto a second connected state. Furthermore, the FSA can comprise an initial state and an accepting state, where the corresponding temporal coverage property is marked as satisfied when the FSA reaches the accepting state. A soft constraint 210 includes a number of Boolean conditions which allow an FSA 208 to navigate away from a corresponding active state and toward covering a corresponding temporal property. An instance of an FSA also includes local weight variables which are used to compute a probability that a corresponding soft constraint can be used to affect the selection of the inputs to the DUV.

Testbench 212 accepts DUV 214, and accepts FSA 208 and the corresponding soft constraints 210 as input to generate input stimuli 218 for temporal coverage property 202. Testbench 212 creates FSA instances during simulation to observe the inputs and outputs of the circuit design, and to determine the soft constraints which can satisfy a respective temporal coverage property. Testbench 212 uses soft constraints 210 to bias the random selection of the input stimuli based on a current state of the FSA instance. A number of FSA instances propose a soft constraint at a respective time frame in the simulation, but those with higher weight values propose a corresponding soft constraint with a higher chance of affecting the selection of the inputs to the DUV.

In one embodiment of the present invention, testbench 212 is generated by a user as an input to a circuit simulator. In another embodiment of the present invention, testbench 212 is automatically generated for the DUV as an input to a circuit simulator. In yet another embodiment of the present invention, testbench 212 is implemented as a software component which interacts with a circuit simulator.

Monitoring mechanism 216 accepts temporal coverage property database 204 and DUV 214 as input, and interacts with testbench 212 to monitor the inputs and outputs of DUV 214 and determine the temporal coverage properties of temporal coverage property database 204 which have been covered by input stimuli 218. In one embodiment of the present invention, testbench 212 includes monitoring mechanism 216.

Conversion Mechanism

Figure 3:
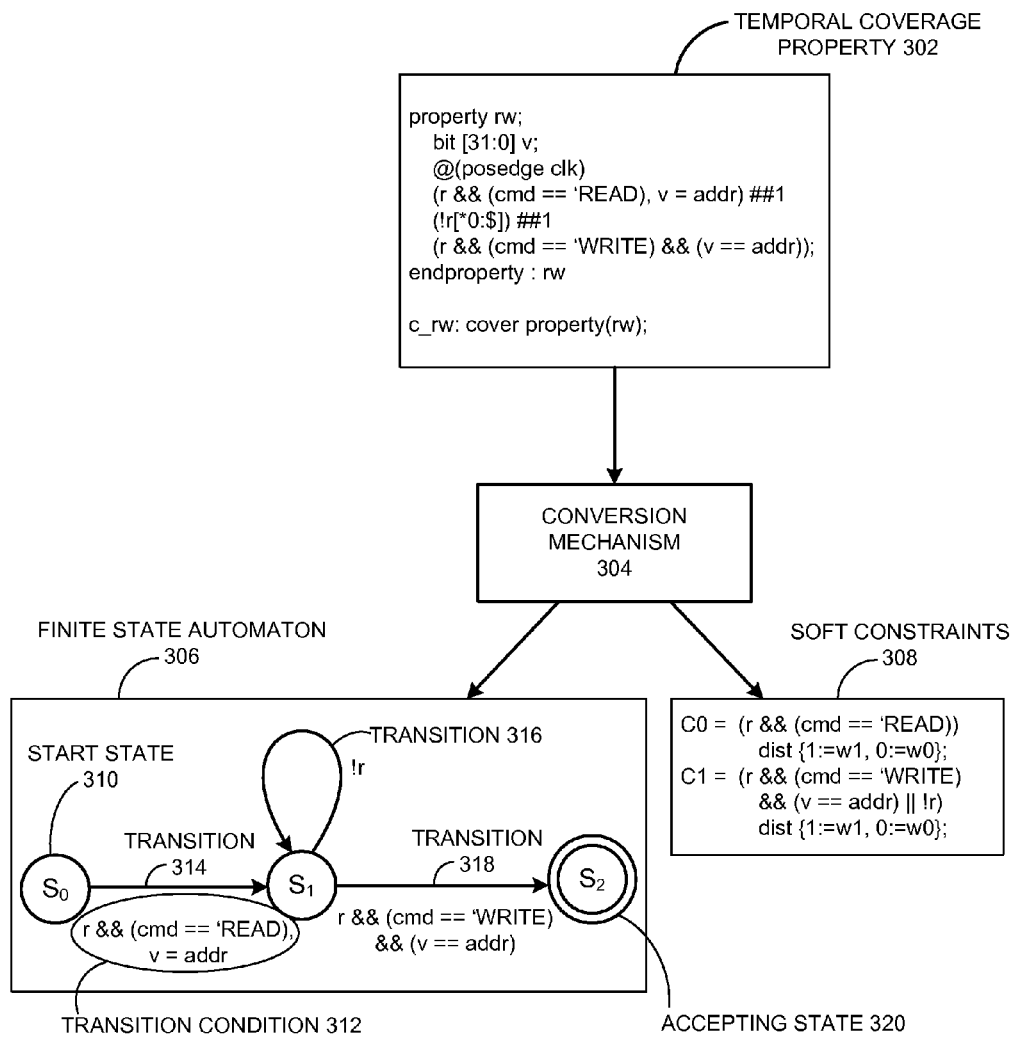
FIG. 3 illustrates an exemplary usage of a conversion mechanism in accordance with an embodiment of the present invention.

FIG. 3 illustrates an exemplary usage of a conversion mechanism 304 in accordance with an embodiment of the present invention. Conversion mechanism 304 accepts a temporal coverage property as input and produces a corresponding finite state automaton and soft constraints as output. The example illustrated in FIG. 3 presents an exemplary temporal coverage property 302 which describes the allowable transactions for a read-modify-write instruction. This example uses the cover property and constraint syntax of SystemVerilog, however, any other formalism can be used. Temporal coverage property 302 begins on an input vector where the request signal "r" is set and the command signal is set to read (cmd=='READ) for a number of clock cycles, such that a store address variable "v" is set to the value of the address bus "addr" (v=addr). This transaction can be followed by a number of input vectors where the request signal "r" is not being set (!r[*0:$]). Finally, temporal coverage property 302 is satisfied when the first two properties are followed by an input vector where the request signal "r" is set and the command signal is set to write (cmd='WRITE) such that the address bus "addr" is set to the same value used by the read transaction of the temporal coverage property "v" (v==addr).

The FSA produced by conversion mechanism 304 includes a number of states and a number of transitions. The states of an FSA include a start state, from which the FSA begins analyzing a temporal coverage property, and includes an accepting state, which can only be reached when the temporal coverage property is satisfied by a given input sequence. The outgoing transition condition of a start state describes the starting condition of a temporal coverage property, and the incoming transition of an accepting state describes the final condition for satisfying a temporal coverage property. The intermediate states of an FSA and the transition conditions between them describe the possible sequences of input vectors which can lead to satisfying the temporal coverage property.

When an FSA is instantiated during the simulation of the DUV, the transition condition of an outgoing transition from the start state is computed against the input vector values of the DUV as soon as the positive edge of the clock signal is encountered. If the transition condition is satisfied by the current values from the simulation, the FSA is advanced to the target state of the transition. Otherwise, if the transition condition is not satisfied by the current values from the simulation, the FSA instance is destroyed. A similar analysis is performed by the FSA instance at the internal states as the FSA instance transitions toward the accepting state. If the current input sequence satisfies the temporal coverage property, the FSA instance will reach the accepting state. Otherwise, if the current input sequence does not satisfy the temporal coverage property, the FSA instance will be destroyed and thus will not influence the stimulus generation any further.

With respect to temporal coverage property 302, conversion mechanism 304 creates FSA 306 with a start state 310 and an accepting state 320. When FSA 306 is instantiated during the simulation of the DUV, transition condition 312 is computed against the input vector values of the DUV as soon as the positive edge of the clock signal is encountered. If transition condition 312 is satisfied by the current values from the simulation, the instance of FSA 306 is advanced to state $S_1$. Otherwise, if transition condition 312 is not satisfied by the current values from the simulation, the instance of FSA 306 is destroyed. A similar analysis is performed by the instance of FSA 306 at the internal states as the FSA instance transitions across state $S_1$ toward accepting state 320. If the current input sequence satisfies temporal coverage property 302, the instance of FSA 306 will reach accepting state 320. Otherwise, if the current input sequence does not satisfy temporal coverage property 302, the instance of FSA 306 will be destroyed before it reaches accepting state 320.

The soft constraints 308 produced by conversion mechanism 304 include a number of soft constraints wherein a respective soft constraint includes the union of the transition conditions of the outgoing transitions from a corresponding state in the FSA. With respect to FSA 306, conversion mechanism 304 creates soft constraint C0 for state $S_0$ from the transition condition of transition 314, and creates soft constraint C1 for state $S_1$ from the union of the transition conditions for transitions 316 and 318.

A number of FSA instances are simultaneously monitoring the input vectors of the circuit simulation to attempt to bias the input vector toward reaching a corresponding accepting state. As the simulation time progresses, a new FSA instance will have a lower likelihood of reaching a corresponding accepting state than an FSA instance which has been active for a given period of time. Therefore, it is important to gauge the probability that an FSA instance will bias the input stimuli toward a corresponding state, and gauge the probability that the soft constraint of the FSA instance will evaluate to true or false.

The variables w0 and w1 of a soft constraint are weights used to propose a probability that the Boolean expression will evaluate to zero or one. These variables are local to an FSA instance, thus the weight values set by one FSA instance do not interfere with the weight values set by another FSA instance. The weights w0 and w1 impose an approximate probability w1/(w1+w0) that the Boolean expression will evaluate to one for a corresponding FSA instance, and impose an approximate probability w0/(w0+w1) that the Boolean expression will evaluate to zero. Therefore, the weights w0 and w1 are used to provide a soft constraint corresponding to an FSA instance with a probability of being selected to bias the input vectors at a respective time instance of the circuit simulation.

The variable w1 of an FSA instance is set to a value w10 upon instantiation, and is increased by a value Dw whenever the FSA instance traverses a transition of the FSA graph. Incrementing w1 of an FSA instance by Dw effectively increases the calculated value for the approximate probability that the soft constraint evaluates to one, and reflects the increased probability that the FSA instance will reach the accepting state. In other words, the weight w1 of an FSA instance is increasing in value as the FSA instance progresses in time toward the accepting state. This ensures the FSA instances which are closer to reaching the accepting state have a higher likelihood of biasing the input stimuli than FSA instances which are farther from an accepting state. With respect to FSA 306, the weight w1 is increased by Dw whenever the FSA instance reaches state $S_1$ (e.g., through transition 316).

Constrained Random Simulation

Figure 4:
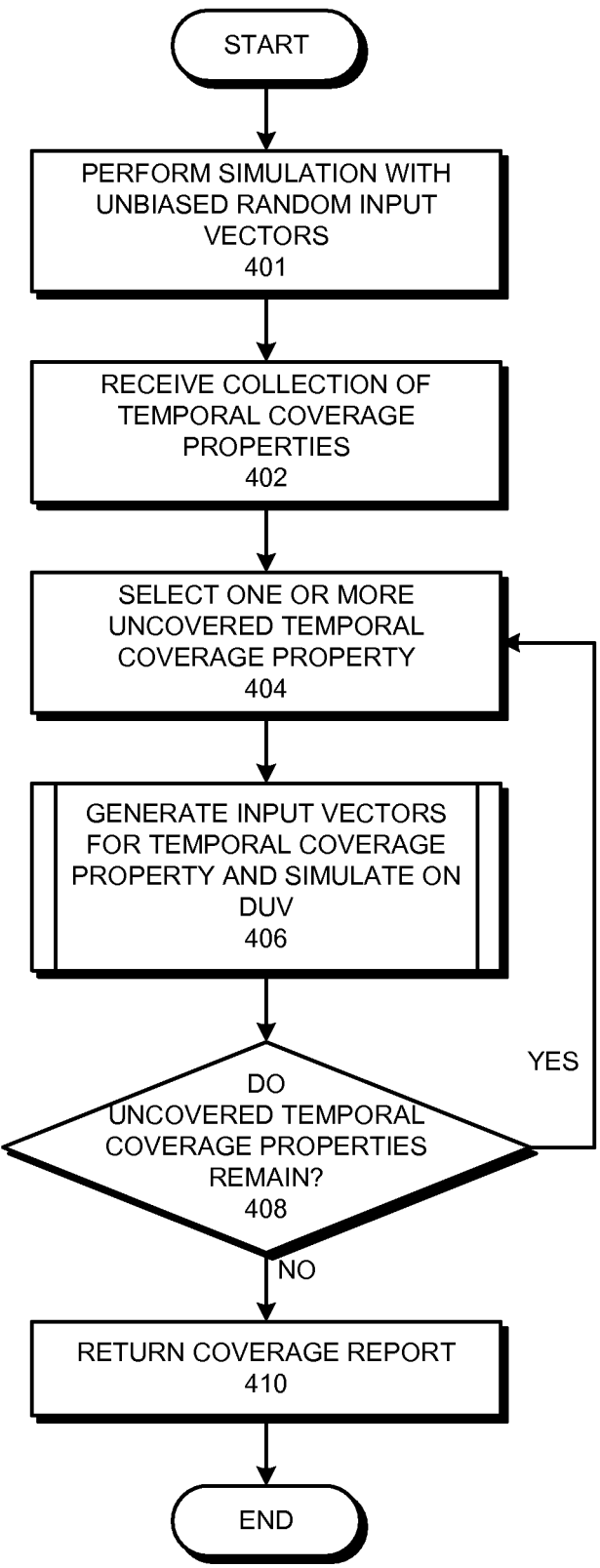
FIG. 4 presents a flowchart illustrating the steps involved in generating input vectors to achieve coverage closure in accordance with an embodiment of the present invention.

FIG. 4 presents a flowchart illustrating the steps involved in generating input vectors to achieve coverage closure in accordance with an embodiment of the present invention. Before the system generates biased random input vectors, the system begins by performing a simulation on the circuit design with unbiased random input vectors (operation 401). Once the non-biased simulation is complete, the system performs a subsequent simulation which biases the random input stimuli to satisfy the temporal coverage properties which were not covered during the non-biased simulation.

To generate biased random input vectors, the system first receives a collection of temporal coverage properties (operation 402), and selects an uncovered temporal coverage property (operation 404). Next, the system generates input vectors for the selected temporal coverage property (operation 406). The system then determines if uncovered temporal coverage properties remain (operation 408). If so, the system returns to operation 404 to select another uncovered temporal coverage property. Otherwise if no more uncovered temporal coverage properties remain, then coverage closure has been achieved and the system returns a coverage report (operation 410).

Figure 5:
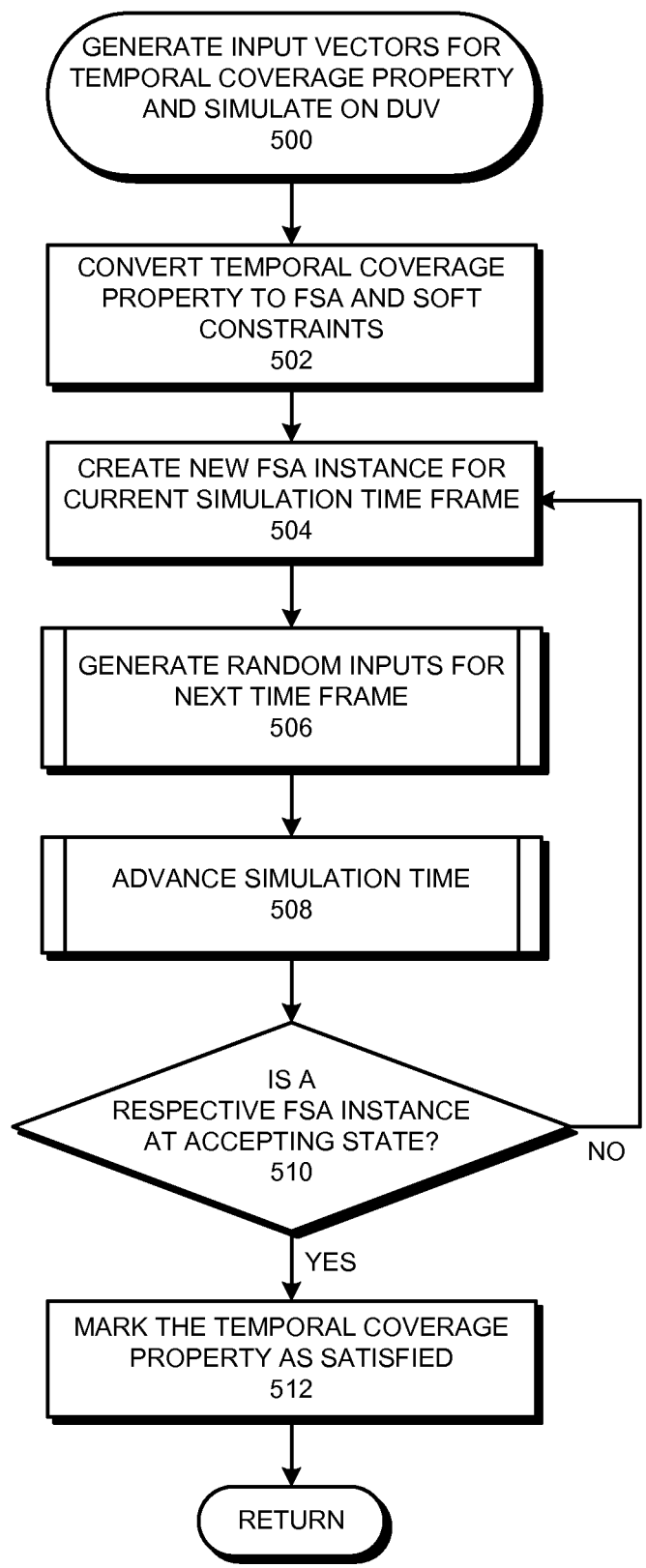
FIG. 5 presents a flowchart illustrating the steps involved in generating input vectors for a temporal coverage property in accordance with an embodiment of the present invention.

FIG. 5 presents a flowchart illustrating the steps involved in generating input vectors for a temporal coverage property in accordance with an embodiment of the present invention (operation 500). The system first converts the temporal coverage property to an FSA and a corresponding collection of soft constraints (operation 502). Next, the system creates a new FSA instance for the current simulation time frame (operation 504). The system then generates random inputs for the next time frame (operation 506) by selecting a soft constraint from the collection of FSA instances to bias the random input vectors, and the system advances the simulation time (operation 508). The system then determines if a respective FSA instance is at the accepting state (operation 510). If no FSA instance is at the accepting state, the system returns to operation 504 to generate input vectors for the next simulation time frame. Otherwise, if an FSA instance is at the accepting state, the system marks the temporal coverage property as satisfied (operation 512).

Figure 6:
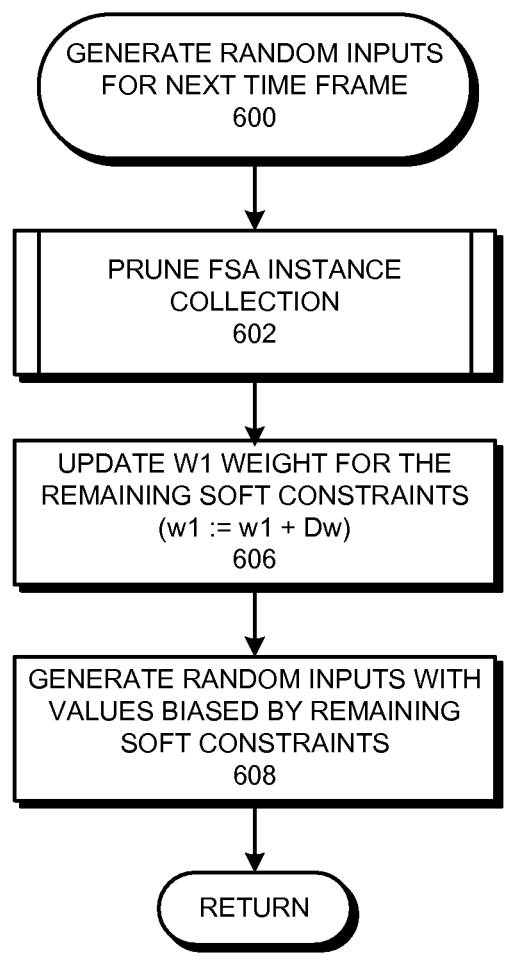
FIG. 6 presents a flowchart illustrating the steps involved in generating random inputs for a subsequent time frame in accordance with an embodiment of the present invention.

FIG. 6 presents a flowchart illustrating the steps involved in generating random inputs for a subsequent time frame in accordance with an embodiment of the present invention (operation 600). The system first prunes the FSA instance collection (operation 602) to destroy the FSA instances which cannot reach the accepting state. Next, the system updates the w1 weight for the remaining soft constraints by incrementing w1 by Dw (operation 606). Finally, the system generates the next set of random inputs with values which are biased by a number of remaining soft constraints (operation 608). In one embodiment of the present invention, the system selects one soft constraint to bias the selection of the inputs to the DUV by selecting the FSA instance with the highest weight. In other embodiments, the system uses a collection of soft constraints simultaneously, wherein the soft constraints which correspond to FSA instances with higher weights have a greater influence on the selection of the inputs to the DUV. Using the soft constraints to bias the input stimuli involves biasing the random selection of the input stimuli based on the current state of the FSA instances, wherein the random values generated for the inputs have a higher probability to conform to the requirements in the soft constraint with the highest w1 weight.

Figure 7:
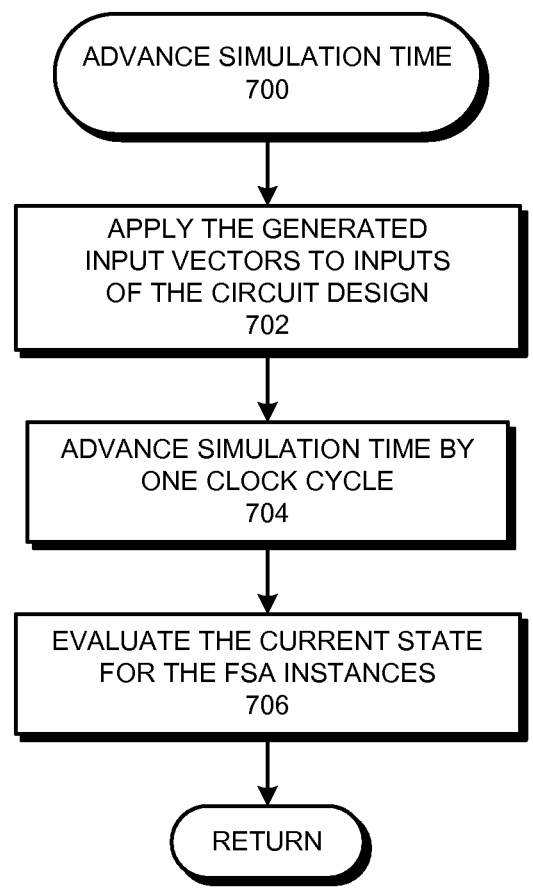
FIG. 7 presents a flowchart illustrating the steps involved in advancing the simulation time in accordance with an embodiment of the present invention.

FIG. 7 presents a flowchart illustrating the steps involved in advancing the simulation time in accordance with an embodiment of the present invention (operation 700). First, the system applies the generated input vectors to the inputs of the circuit design under verification (operation 702). Next, the system advances the simulation time by one clock cycle (operation 704) and evaluates the current state for the FSA instances (operation 706).

Figure 8:
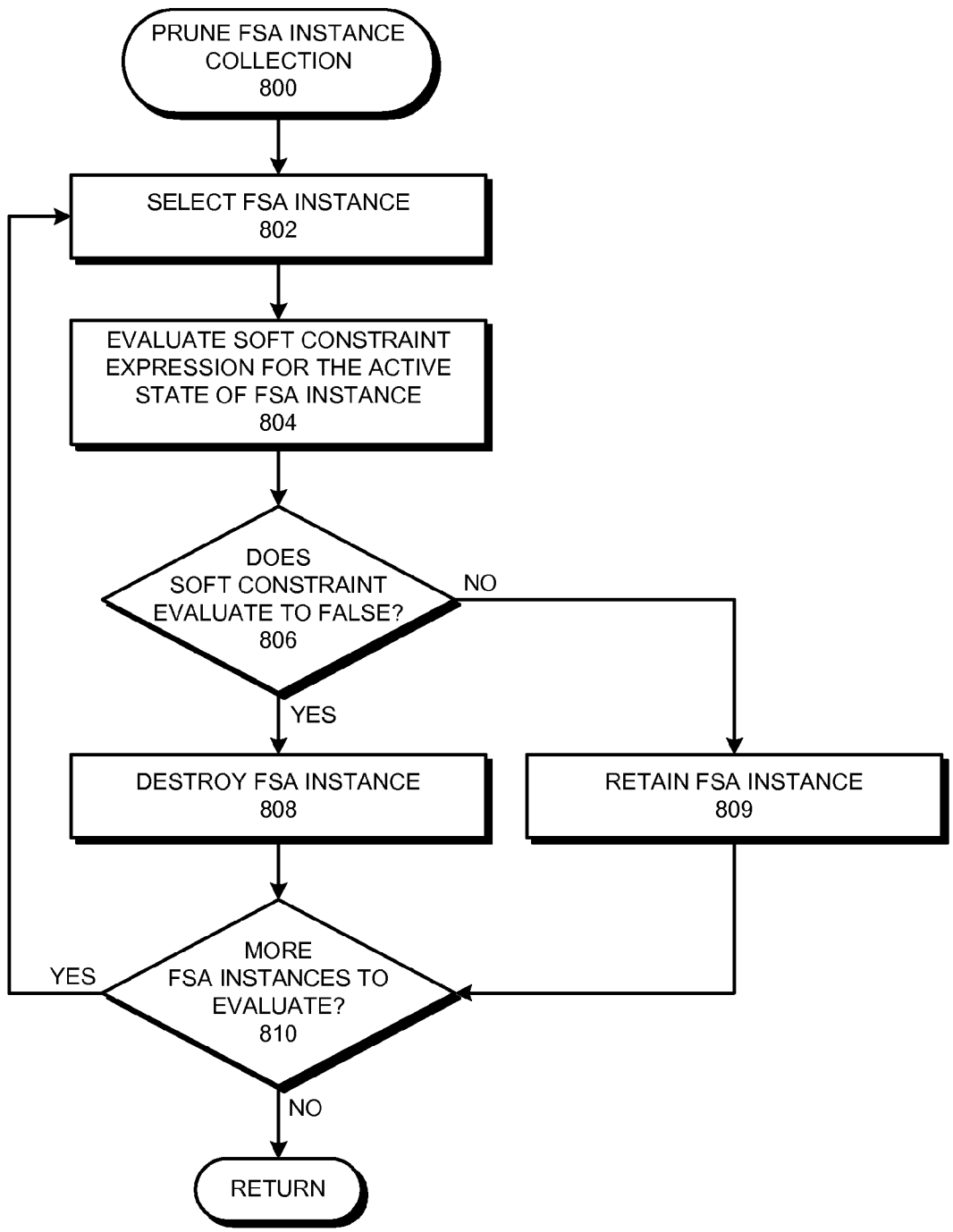
FIG. 8 presents a flowchart illustrating the steps involved in pruning the FSA instance collection in accordance with an embodiment of the present invention.

FIG. 8 presents a flowchart illustrating the steps involved in pruning the FSA instance collection in accordance with an embodiment of the present invention (operation 800). To prune the FSA instance collection, the system first selects an FSA instance to evaluate (operation 802) and then evaluates the soft constraint expression for the active state of the FSA instance (operation 804). Next, the system determines if the soft constraint expression evaluates to false. If so, the system destroys the FSA instance (operation 808). Otherwise, if the soft constraint expression does not evaluate to false, the FSA instance is retained in the collection (operation 809). Finally, the system determines if there are more FSA instances to evaluate (operation 810). If an FSA instance which has not been evaluated remains, the system returns to operation 802 to select and evaluate an FSA instance which has not yet been evaluated.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for verifying a circuit which biases input stimuli for the circuit to satisfy one or more temporal coverage properties to be verified for the circuit, comprising:
    performing, by using one or more computers, a simulation in which random input stimuli are applied to the circuit; wherein said performing the simulation involves,
        using a finite state automaton (FSA) instance for a temporal coverage property to observe inputs and outputs of the circuit, wherein the FSA instance includes a sequence of states which satisfy the temporal coverage property, and wherein using the FSA instance involves concurrently using multiple FSA instances associated with one or more temporal coverage properties to observe the inputs and outputs of the circuit; and
        using soft constraints associated with the FSA instance to bias input stimuli for the circuit so that the simulation is likely to progress through the sequence of states.

2. The method of claim 1, wherein said using soft constraints to bias the input stimuli for the circuit involves biasing a random selection of the input stimuli based on a current state of the FSA instance.

3. The method of claim 1, wherein if the FSA instance reaches an accepting state for the temporal coverage property, the method further comprises marking the temporal coverage property as satisfied.

4. The method of claim 1, wherein said biasing the input stimuli for the circuit involves ensuring that FSA instances which are closer to an accepting state have a higher likelihood of biasing the input stimuli than FSA instances which are farther from an accepting state.

5. The method of claim 1, wherein prior to performing the simulation, the method further comprises performing a preceding non-biased simulation in which the input stimuli to the circuit are not biased to satisfy specific temporal coverage properties; and
    wherein after the preceding non-biased simulation is complete, the simulation subsequently biases the input stimuli to cover temporal coverage properties which were not covered during the preceding non-biased simulation.

6. The method of claim 1, wherein prior to performing the simulation, the method further comprises converting the temporal coverage property into the FSA instance and the soft constraints.

7. The method of claim 6, wherein the FSA is a deterministic FSA.

8. A circuit verification system which biases input stimuli for a circuit to satisfy one or more temporal coverage properties to be verified for the circuit, comprising:
    a conversion mechanism configured to convert a respective temporal coverage property into a corresponding finite state automaton (FSA) and into a corresponding collection of soft constraints, wherein the corresponding collection of soft constraints defines allowable transitions across the FSA; and
    a testbench environment configured to perform a simulation in which random input stimuli are applied to the circuit, wherein the testbench environment performs the simulation by:
        using an FSA instance for a temporal coverage property to observe inputs and outputs of the circuit, wherein the FSA instance includes a sequence of states which satisfy the temporal coverage property, and wherein using the FSA instance involves concurrently using multiple FSA instances associated with one or more temporal coverage properties to observe the inputs and outputs of the circuit; and using soft constraints associated with the FSA instance to bias input stimuli for the circuit so that the simulation is likely to progress through the sequence of states.

9. The circuit verification system of claim 8, wherein said using soft constraints to bias the input stimuli for the circuit involves biasing a random selection of the input stimuli based on a current state of the FSA instance.

10. The circuit verification system of claim 8, wherein if the FSA instance reaches an accepting state for the temporal coverage property, the method further comprises marking the temporal coverage property as satisfied.

11. The circuit verification system of claim 8, wherein said biasing the input stimuli for the circuit involves ensuring that FSA instances which are closer to an accepting state have a higher likelihood of biasing the input stimuli than FSA instances which are farther from an accepting state.

12. The circuit verification system of claim 8, wherein the FSA is a deterministic FSA.

13. The circuit verification system of claim 8,
wherein prior to performing the simulation, the testbench environment is further configured to perform a preceding non-biased simulation in which the input stimuli to the circuit are not biased to satisfy specific temporal coverage properties; and
wherein after the preceding non-biased simulation is complete, the simulation subsequently biases the input stimuli to cover temporal coverage properties which were not covered during the preceding non-biased simulation.

14. The circuit verification system of claim 8, further comprising a monitoring mechanism configured to:
monitor the inputs and outputs of the circuit, and
during simulation of a given input stimuli, to determine the temporal coverage properties which have been covered by the input stimuli.

15. A non-transitory computer-readable storage medium storing instructions that when executed by a computer cause the computer to perform a method for verifying a circuit which biases input stimuli for the circuit to satisfy one or more temporal coverage properties to be verified for the circuit, comprising:
performing a simulation in which random input stimuli are applied to the circuit;
wherein performing the simulation involves,
using a finite state automaton (FSA) instance for a temporal coverage property to observe inputs and outputs of the circuit, wherein the FSA instance includes a sequence of states which satisfy the temporal coverage property, and wherein using the FSA instance involves concurrently using multiple FSA instances associated with one or more temporal coverage properties to observe the inputs and outputs of the circuit, and
using soft constraints associated with the FSA instance to bias input stimuli for the circuit so that the simulation is likely to progress through the sequence of states.

16. The non-transitory computer-readable storage medium of claim 15, wherein said using soft constraints to bias the input stimuli for the circuit involves biasing a random selection of the input stimuli based on a current state of the FSA instance.

17. The non-transitory computer-readable storage medium of claim 15, wherein if the FSA instance reaches an accepting state for the temporal coverage property, the method further comprises marking the temporal coverage property as satisfied.

18. The non-transitory computer-readable storage medium of claim 15, wherein said biasing the input stimuli for the circuit involves ensuring that FSA instances which are closer to an accepting state have a higher likelihood of biasing the input stimuli than FSA instances which are farther from an accepting state.

19. The non-transitory computer-readable storage medium of claim 15, wherein prior to performing the simulation, the method further comprises performing a preceding non-biased simulation in which the input stimuli to the circuit are not biased to satisfy specific temporal coverage properties; and
wherein after the preceding non-biased simulation is complete, the simulation subsequently biases the input stimuli to cover temporal coverage properties which were not covered during the preceding non-biased simulation.

20. The non-transitory computer-readable storage medium of claim 15, wherein prior to performing the simulation, the method further comprises converting the temporal coverage property into the FSA instance and the soft constraints.

21. The non-transitory method of claim 20, wherein the FSA instance is a deterministic FSA instance.

* * * * *